United States Patent
Kawagoshi

[11] Patent Number: 5,869,865
[45] Date of Patent: Feb. 9, 1999

[54] LATERAL FIELD EFFECT TRANSISTOR WITH MINIMUM TOTAL ON-RESISTANCE

[75] Inventor: Hirokazu Kawagoshi, Shiga, Japan

[73] Assignee: NEC Corporation, Tokyo, Japan

[21] Appl. No.: 881,362

[22] Filed: Jun. 24, 1997

[30] Foreign Application Priority Data

Jun. 24, 1996 [JP] Japan ................................ 8-162558

[51] Int. Cl.$^6$ ........................... H01L 29/76; H01L 29/94; H01L 31/062
[52] U.S. Cl. ........................ 257/342; 257/343; 257/401
[58] Field of Search ................................ 257/341, 342, 257/344, 401, 408

[56] References Cited

U.S. PATENT DOCUMENTS 4,845,536  7/1989  Heinecke et al. ........................ 257/401

Primary Examiner—Wael Fahmy
Attorney, Agent, or Firm—Sughrue, Mion, Zinn, Macpeak & Seas, PLLC

[57] ABSTRACT

In a rectangular lateral field effect transistor including a rectangular active region formed within a semiconductor substrate, and at least one rectangular wiring layer formed on the semiconductor substrate on one side of the rectangular active region, the rectangular active region has a length A in a first direction and a length k·x in a second direction, the rectangular wiring layer has a length A in the first direction and a length x in the second direction, wherein k is substantially defined by $$k = \sqrt{2A_r/(A^2 \cdot \rho)}$$

where $A_r$ is a resistance value of an ON-resistance of said rectangular active region per unit area, and $\rho$ is a sheet resistance of the rectangular wiring layer.

6 Claims, 4 Drawing Sheets

LATERAL FIELD EFFECT TRANSISTOR WITH MINIMUM TOTAL ON-RESISTANCE

BACKGROUND OF THE INVENTION

1. Field of the Invention

The present invention relates to a lateral field effect transistor.

2. Description of the Related Art

A prior art rectangular lateral field effect transistor includes a rectangular active region formed within a semiconductor substrate, and at least one rectangular wiring layer formed on the semiconductor substrate on one side of the rectangular active region. The rectangular wiring layer is made of aluminum or the like.

In the above-described prior art rectangular lateral field effect transistor, the width of the rectangular wiring layer is determined in view of the melting current flowing through the aluminum or the like and electromigration of the aluminum or the like. In this case, however, the total ON-resistance may be increased. Otherwise, in order to reduce the total ON-resistance, the area of the transistor may be increased, thus reducing the integration.

SUMMARY OF THE INVENTION

It is an object of the present invention to reduce the total ON-resistance of a rectangular lateral field effect transistor without increasing the area thereof.

According to the present invention, in a rectangular lateral field effect transistor including a rectangular active region formed within a semiconductor substrate, and at least one rectangular wiring layer formed on the semiconductor substrate on one side of the rectangular active region, the rectangular active region has a length A in a first direction and a length k·x in a second direction, the rectangular wiring layer has a length A in the first direction and a length x in the second direction, wherein k is substantially defined by $$k = \sqrt{2A_r/(A^2 \cdot \rho)}$$

where $A_r$ is a resistance value of an ON-resistance of said rectangular active region per unit area, and $\rho$ is a sheet resistance of the rectangular wiring layer.

Thus, the total ON-resistance of the transistor can be minimized under the condition that the rectangle comprising the transistor is definite.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Figure 1:
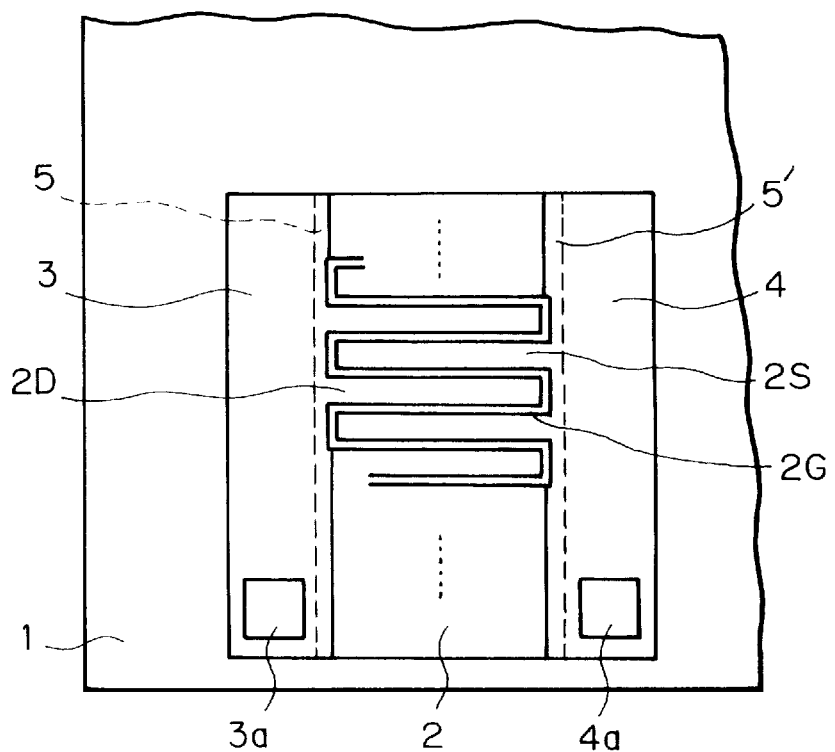
FIG. 1 is a plan view illustrating a first embodiment of the rectangular lateral field effect transistor according to the present invention.

In FIG. 1, which is a plan view illustrating a first embodiment of the rectangular lateral field effect transistor according to the present invention, a rectangular active region 2 is provided within a semiconductor substrate 1. Also, a rectangular drain wiring layer 3 and a rectangular source wiring layer 4 are formed on the semiconductor substrate 1 on both sides of the active region 2. The drain wiring layer 3 and the source wiring layer 4 are made of aluminum. Further, two rectangular gate wiring layers 5 and 5' are formed on the semiconductor substrate 1 below the drain wiring layer 3 and the source wiring layer 4, respectively. In addition, a drain pad 3a is formed on the drain wiring layer 3, and a source pad 4a is formed on the wiring layer 4.

The active region 2 is formed by a comb-shaped drain region 2D, a comb-shaped source region 2S interleaving the comb-shaped drain region 2D, and a gate region 2G between the drain region 2D and the source region 2S.

Figure 2:
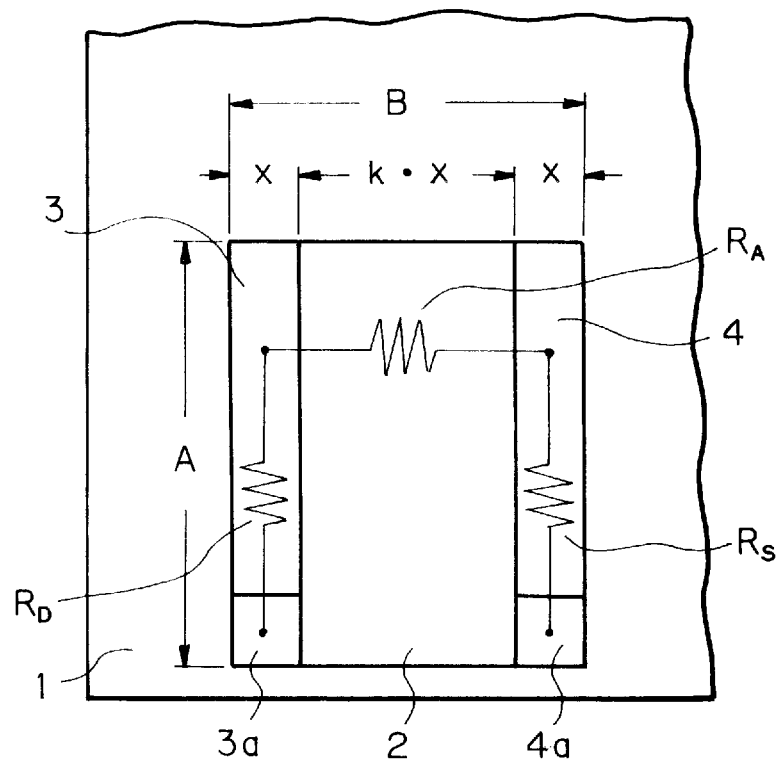
FIG. 2 is a diagram for explaining the dimensions of the transistor of FIG. 1.

The dimensions of the entire field effect transistor, the active region 2, the drain wiring layer 3 and the source wiring layer 4 of FIG. 1 are defined as shown in FIG. 2. That is, the rectangle comprising the entire field effect transistor is defined by A×B, the rectangle comprising the active region 2 is defined by A ×k·x, the rectangle comprising the drain region 3 is defined by A×x, and the rectangle comprising the source region 4 is defined by A×x. Here, A and B are constant, and the values k and x satisfy the following:

$$B = x + k \cdot x + x \therefore 1/x = (2+k)/B \quad (1)$$

The total ON-resistance $R_{on}$ of the field effect transistor of FIG. 2 is defined by $$R_{on} = R_D + R_A + R_S \quad (2)$$

where $R_D$ is an equivalent resistance of the drain wiring layer 3;

$R_A$ is an equivalent resistance of the active region 2; and $R_S$ is an equivalent resistance of the source wiring layer 4.

On the other hand, the equivalent resistance $R_D$ can be represented by $$R_D = \rho \cdot A/2x \quad (3)$$

where $\rho$ is a sheet resistance of aluminum. Also, the equivalent resistance $R_A$ can be represented by $$R_A = A_r/(A \cdot k \cdot x) \quad (4)$$

where $A_r$ is a resistance value of the ON-resistance of the active region 2 per unit area. Further, the equivalent resistance $R_S$ can be represented by $$R_S = \rho \cdot A/2x \quad (5)$$

From the formula (2), (3), (4) and (5), $$\begin{aligned}R_{on} &= \rho \cdot A/2x + A_r/(A \cdot k \cdot x) + \rho \cdot A/2x \\ &= \rho \cdot A/x + A_r/(A \cdot k \cdot x)\end{aligned} \quad (6)$$

From the formula (1) and (6)

$$R_{on} = (\rho \cdot A + A_r/(A \cdot k)) \cdot (2+K)/B \quad (7)$$

Therefore, $$\partial R_{on}/\partial k = \rho \cdot A/B - 2A_r/(A \cdot B \cdot k^2) \quad (8)$$

-continued

If $\partial R_{on}/\partial k = 0$, then $$k = \sqrt{2A_r/(A^2 \cdot \rho)} \quad (9)$$

In view of the foregoing, when the width ratio k of the active region 2 to the drain region 3 and the source region 4 is $\sqrt{2A_r/(A^2 \cdot \rho)}$, the ON-resistance $R_{on}$ of the field effect transistor of FIG. 1 can be minimized.

Figure 3:
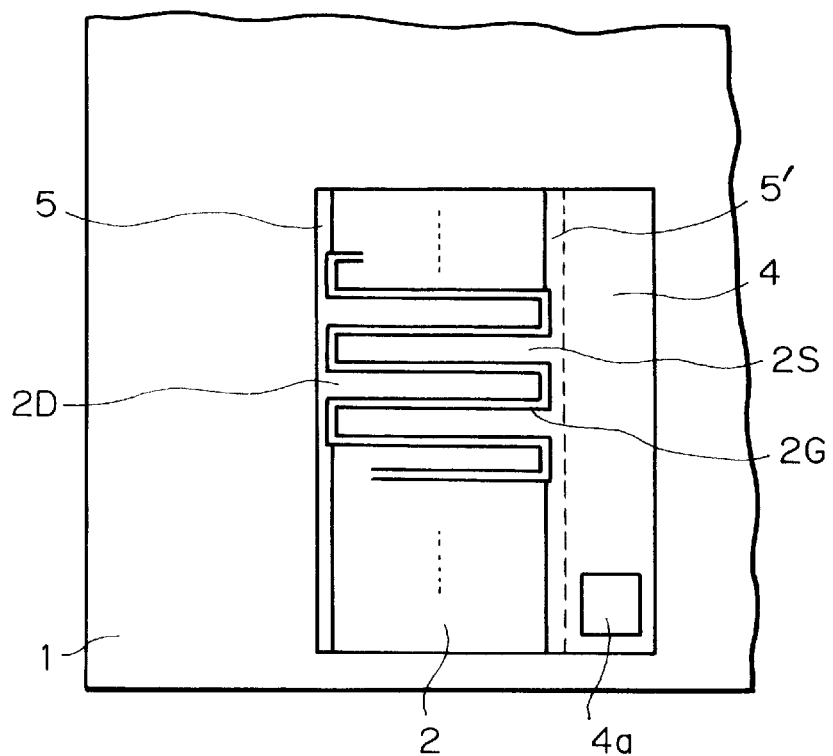
FIG. 3 is a plan view illustrating a second embodiment of the rectangular lateral field effect transistor according to the present invention.

In FIG. 3, which is a plan view illustrating a second embodiment of the rectangular lateral field effect transistor according to the present invention, the drain wiring layer 3 and the drain pad 3a of FIG. 1 are not provided. In this case, the drain region 2D is directly connected to an internal circuit, or the drain region 2D is connected to a drain wiring layer of another field effect transistor.

Figure 4:
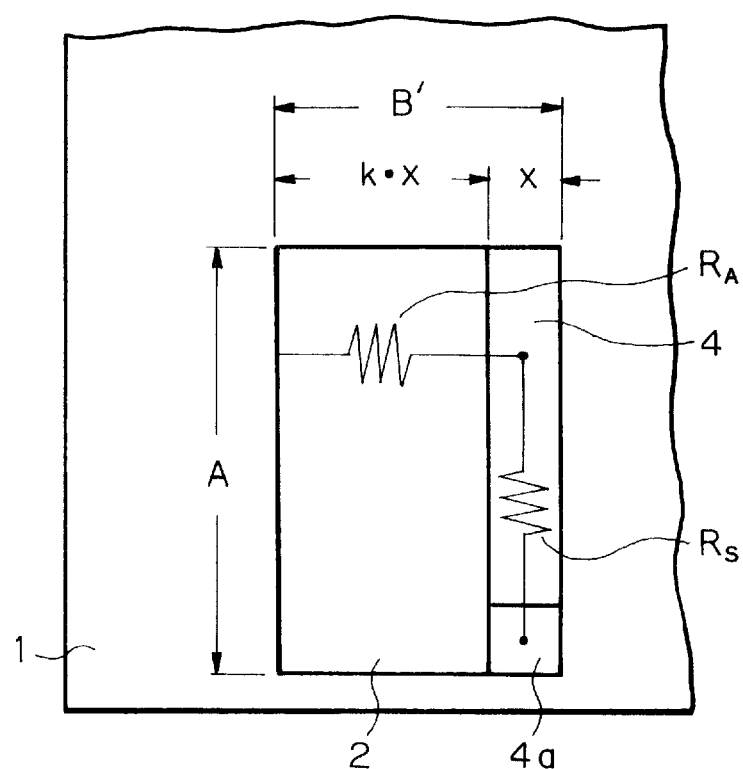
FIG. 4 is a diagram for explaining the dimensions of the transistor of FIG. 3.

The dimensions of the entire field effect transistor, the active region 2 and the source wiring layer 4 of FIG. 3 are defined as shown in FIG. 4. That is, the rectangle comprising the entire effect transistor is defined by A×B', the rectangle comprising the active region 2 is defined by A×k·x, and the rectangle comprising the source region 4 is defined by A×x. Here, A and B' are constant, and the values k and x satisfy the following:

$$B' = k \cdot x + x \therefore 1/x = (1+k)/B' \quad (10)$$

The total ON-resistance $R'_{on}$ of the field effect transistor of FIG. 4 is defined by $$R'_{on} = R_A + R_S \quad (11)$$

On the other hand, the equivalent resistance $R_A$ can be represented by $$R_A = A_r/(A \cdot k \cdot x) \quad (12)$$

Further, the equivalent resistance $R_S$ can be represented by $$R_S = \rho \cdot A/2x \quad (13)$$

From the formula (11), (12) and (13), $$\begin{aligned} R'_{on} &= A_r/(A \cdot k \cdot x) + \rho \cdot A/2x \\ &= \rho \cdot A/2x + A_r/(A \cdot k \cdot x) \end{aligned} \quad (14)$$

From the formula (10) and (14)

$$R'_{on} = (\rho \cdot A/2 + A_r/(A \cdot k)) \cdot (1+K)/B' \quad (15)$$

Therefore, $$\partial R'_{on}/\partial k = \rho \cdot A/2B' - A_r/(A \cdot B' \cdot k^2) \quad (16)$$

If $\partial R'_{on}/\partial k = 0$, then $$k = \sqrt{2A_r/(A^2 \cdot \rho)} \quad (17)$$

In view of the foregoing, when the width ratio k of the active region 2 to the source region 4 is $\sqrt{2A_r/(A^2 \cdot \rho)}$, the ON-resistance $R'_{on}$ of the field effect transistor of FIG. 3 can be minimized.

In the second embodiment, although the drain wiring layer and the drain pad of the first embodiment are not provided, the present invention can be applied to a rectangular lateral field effect transistor where the source wiring layer and the source pad of the first embodiment are not provided.

As explained hereinabove, according to the present invention, the ON-resistance of a rectangular lateral field effect transistor can be minimized.

I claim:
1. A rectangular lateral field effect transistor comprising:
   a semiconductor substrate;
   a rectangular active region formed within said semiconductor substrate, said rectangular active region having a length A in a first direction and a length k·x in a second direction; and
   a first rectangular wiring layer formed on said semiconductor substrate on a first side of said rectangular active region along said second direction, said first rectangular wiring layer having a length A in said first direction and a length x in said second direction,
   wherein k is substantially defined by

$$k = \sqrt{2A_r/(A^2 \cdot \rho)}$$

to decrease a total ON-resistance of the transistor without increasing the area of the transistor, where $A_r$ is a resistance value of an ON-resistance of said rectangular active region per unit area, and $\rho$ is a sheet resistance of said first rectangular wiring layer.

2. The transistor as set forth in claim 1, wherein said first rectangular wiring layer is made of aluminum.

3. The transistor as set in claim 1, further comprising a second rectangular wiring layer formed on said semiconductor substrate on a second side of said rectangular active region along said second direction, said second rectangular wiring layer having a length A in said first direction and a length x in said second direction, said second rectangular wiring layer being made of the same material as said first rectangular wiring layer.

4. A rectangular lateral field effect transistor comprising:
   a semiconductor substrate;
   a rectangular active region formed within said semiconductor substrate, said rectangular active region having a length A in a first direction and a length k·x in a second direction; and
   a rectangular source wiring layer formed on said semiconductor substrate on a first side of said rectangular active region along said second direction, said rectangular source wiring layer having a length A in said first direction and a length x in said second direction;
   wherein k is substantially defined by $$k = \sqrt{2A_r/(A^2 \cdot \rho)}$$

to decrease a total ON-resistance of the transistor without increasing the area of the transistor, where $A_r$ is a resistance value of an ON-resistance of said rectangular active region per unit area, and $\rho$ is a sheet resistance of said rectangular source wiring layer.

5. The transistor as set forth in claim 4, wherein said source rectangular wiring layer is made of aluminum.

6. The transistor as set in claim 4, further comprising a rectangular drain wiring layer formed on said semiconductor substrate on a second side of said rectangular active region along said second direction, said rectangular drain wiring layer having a length A in said first direction and a length x in said second direction, said rectangular drain wiring layer being made of the same material as said rectangular source wiring layer.

* * * * *